United States Patent
Okino

[11] Patent Number: 5,888,699
[45] Date of Patent: Mar. 30, 1999

[54] PATTERN TRANSFER METHOD AND TRANSFER APPARATUS BY CHARGED PARTICLE BEAM

[75] Inventor: Teruaki Okino, Kanagawa-ken, Japan

[73] Assignee: Nikon Corporation, Tokyo, Japan

[21] Appl. No.: 670,898

[22] Filed: Jun. 26, 1996

[30] Foreign Application Priority Data

Jun. 30, 1995 [JP] Japan .................................... 7-166344

[51] Int. Cl.$^6$ .............................. G03C 5/00; G21K 1/08
[52] U.S. Cl. ..................... 430/296; 430/942; 250/396 R
[58] Field of Search ............................... 430/296, 5, 942; 250/396 R

[56] References Cited

U.S. PATENT DOCUMENTS

| | | | |
|---|---|---|---|
| 4,153,843 | 5/1979 | Pease | 250/492 A |
| 5,468,595 | 11/1995 | Livestay | 430/296 |

Primary Examiner—John A. McPherson
Assistant Examiner—Rosemary Ashton
Attorney, Agent, or Firm—Armstrong, Westerman, Hattori, McLeland, & Naughton

[57] ABSTRACT

Disclosed herein is a pattern transfer method wherein a beam transmitting portion which transmits a charged particle beam and a beam limiting portion which scatters or absorbs the charged particle beam to a greater extent than the beam transmitting portion are disposed in a pattern area of a mask according to a pattern to be transferred onto a radiation-sensitive substrate. The pattern area is irradiated with the charged particle beam, and at least a part of the charged particle beam passing through the mask is led to the substrate to transfer the pattern onto the substrate. When the pattern area is irradiated with the charged particle beam, the dose of charged particle beam applied per unit area of the beam limiting portion is reduced to a quantity smaller than the dose of charged particle beam applied per unit area of the beam transmitting portion. Typically, the reduction of the dose is attained by disposing a dose control member between a charged particle beam radiation source and the mask, and projecting a dark image of a dose limiting portion of the dose control member onto the beam limiting portion of the mask.

5 Claims, 5 Drawing Sheets

PATTERN TRANSFER METHOD AND TRANSFER APPARATUS BY CHARGED PARTICLE BEAM

BACKGROUND OF THE INVENTION

The present invention relates to a pattern transfer method and a transfer apparatus which are usable, for example, for lithography to fabricate semiconductor integrated circuits. More particularly, the present invention relates to a technique whereby a pattern of a mask is transferred onto a radiation-sensitive substrate by using a charged particle beam, e.g. an electron beam, an ion beam, etc.

Methods of transferring a pattern of a mask onto a radiation-sensitive substrate (e.g. a wafer as a substrate of a semiconductor integrated circuit) by using a charged particle beam are disclosed, for example, in Japanese Patent Application Unexamined Publication (KOKAI) Nos. 5-36593 and 5-251317 (the latter corresponding to U.S. Pat. No. 5,260,151). A mask used in these transfer methods has a beam transmitting portion which transmits a charged particle beam and a beam limiting portion which scatters or absorbs the charged particle beam to a greater extent than the beam transmitting portion. The beam transmitting and limiting portions are disposed on the mask according to a pattern to be transferred onto a radiation-sensitive substrate. During transfer process, the whole pattern area of the mask is irradiated with the charged particle beam at a uniform dose. A part of the charged particle beam is scattered or absorbed by the beam limiting portion. Consequently, an intensity contrast is introduced into the charged particle beam which is led to the radiation-sensitive substrate according to the layout of the beam transmitting and limiting portions, thereby enabling the desired pattern to be transferred onto the radiation-sensitive substrate.

In the actual use of the above-described mask, however, the beam limiting portion is caused to generate heat by the energy of the applied charged particle beam. If the beam limiting portion is thermally deformed, the transfer position is displaced, or the transfer pattern is distorted. Thus, the use of the conventional mask is likely to degrade the transfer accuracy.

An object of the present invention is to provide a pattern transfer method and a transfer apparatus which are capable of minimizing the generation of heat from a mask and hence improving the transfer accuracy.

SUMMARY OF THE INVENTION

The present invention provides a pattern transfer method wherein a beam transmitting portion which transmits a charged particle beam and a beam limiting portion which scatters or absorbs the charged particle beam to a greater extent than the beam transmitting portion are disposed in a pattern area of a mask according to a pattern to be transferred onto a radiation-sensitive substrate, and wherein the pattern area is irradiated with the charged particle beam, and at least a part of the charged particle beam passing through the mask is led to the radiation-sensitive substrate to transfer the pattern onto the radiation-sensitive substrate.

In this method, when the pattern area is irradiated with the charged particle beam, the dose of charged particle beam applied per unit area of the beam limiting portion of the mask pattern area is reduced to a quantity smaller than the dose of charged particle beam applied per unit area of the beam transmitting portion.

Thus, it is possible to prevent unnecessary incidence of energy on the mask and hence possible to suppress the generation of heat from the mask.

In the above-described method, the expression "the dose of charged particle beam applied per unit area of the beam limiting portion" as used herein means a value (D1/S1) determined by dividing the total dose D1 of charged particle beam applied to the beam limiting portion by the total area S1 of the beam limiting portion. The expression "the dose of charged particle beam applied per unit area of the beam transmitting portion" as used herein means a value (D2/S2) determined by dividing the total dose D2 of charged particle beam applied to the beam transmitting portion by the total area S2 of the beam transmitting portion.

In addition, the present invention provides a pattern transfer method wherein a part or all of a plurality of pattern areas provided on a mask are sequentially irradiated with a charged particle beam to transfer patterns provided in the irradiated pattern areas onto a radiation-sensitive substrate. In this method, the distribution of the dose of charged particle beam in each of the plurality of pattern areas is varied according to the pattern provided in the pattern area.

In addition, the present invention provides a charged particle beam transfer apparatus having an irradiation system for irradiating a pattern area of a mask with a charged particle beam, and a projection system for leading at least a part of the charged particle beam passing through the pattern area of the mask to a radiation-sensitive substrate.

The apparatus is provided with a dose reducing system whereby the dose of charged particle beam applied per unit area of a portion of the pattern area of the mask which scatters or absorbs the charged particle beam to a degree higher than a predetermined level is reduced to a quantity smaller than the dose of charged particle beam applied per unit area of the other portion of the pattern area.

Thus, it is possible to prevent unnecessary incidence of energy on the mask and hence possible to suppress the generation of heat from the mask.

In addition, the present invention provides a charged particle beam transfer apparatus having an irradiation system capable of selectively applying a charged particle beam to each of a plurality of pattern areas of a mask, and a projection system for leading at least a part of the charged particle beam applied by the irradiation system and passing through the pattern area to a radiation-sensitive substrate. The apparatus is provided with a dose distribution control system for varying the distribution of the dose of charged particle beam in each of the plurality of pattern areas according to a pattern provided in the pattern area.

The beam limiting portion of the mask is provided for the purpose of preventing the applied charged particle beam from being incident on the radiation-sensitive substrate; it is originally unnecessary to apply a charged particle beam to the beam limiting portion. The present invention was made by taking notice of this fact. Thus, the present invention makes it possible to prevent unnecessary incidence of energy on the mask and to suppress the generation of heat from the mask. According to one aspect of the present invention, the dose of charged particle beam applied to the beam limiting portion of the mask is limited by a dose limiting portion of a dose control member which is provided closer to a radiation source of the charged particle beam than the mask. In a case where the mask is provided with a plurality of pattern areas, the charged particle beam dose distribution in each pattern area is varied according to the pattern provided in the pattern area, whereas the dose distribution has heretofore been uniform throughout each pattern area regardless of the pattern provided therein. Accordingly, it is possible to prevent unnecessary incidence of energy on the mask for each pattern area, and thus the generation of heat from the mask can be suppressed.

In the above-described pattern transfer method, if the mask is provided with a plurality of pattern areas having different patterns, it is necessary to provide the dose control member with a plurality of areas and to form a dose limiting portion for each area depending on the pattern in each pattern area of the mask. During the pattern transfer process, it is necessary to select an area which is to be irradiated with the charged particle beam according to the pattern of a specific pattern area of the mask and to lead an image of the selected area to the mask. The present invention also provides a transfer apparatus which is suitable for such a pattern transfer operation.

More specifically, the present invention provides a charged particle beam transfer apparatus having a charged particle beam optical system, and a mask moving device for moving a mask such that the mask crosses an optical axis of the charged particle beam optical system, wherein a member moving device for moving a member different from the mask such that the member crosses the optical axis is provided closer to a radiation source of the charged particle beam optical system than the mask moving device, and the charged particle beam optical system is provided with a projection system for projecting an image of the member onto the mask when the member mounted on the member moving device is irradiated with the charged particle beam.

In addition, the present invention provides a charged particle beam transfer apparatus having a charged particle beam optical system, and a mask moving device for moving a mask such that the mask crosses an optical axis of the charged particle beam optical system, wherein a member is provided so as to cover the mask from a side closer to a radiation source of the charged particle beam optical system, and the mask moving device is provided with a support device for supporting the member such that the member is movable together with the mask as one unit.

BRIEF DESCRIPTION OF THE DRAWINGS

FIGS. 3A and 3B are perspective views showing a transfer procedure using the apparatus shown in FIG. 2, in which

DETAILED DESCRIPTION

A first embodiment of the present invention will be described below with reference to FIGS. 1A to 3B. FIG. 2 schematically shows a transfer apparatus used in this embodiment. Referring to FIG. 2, an electron gun 1 emits an electron beam EB. A pair of condenser lenses 2 and 3 concentrate the electron beam EB from the electron gun 1. A first aperture 4 shapes the electron beam EB into a beam of a square cross-sectional configuration. A condenser lens 5 concentrates the electron beam passing through the first aperture 4. In FIG. 2, a z-axis is taken in a direction parallel to an optical axis AX of the electron gun 1. A y-axis is taken in a direction perpendicularly intersecting the optical axis AX (i.e. a horizontal direction as viewed in FIG. 2), and an x-axis is taken in a direction perpendicularly intersecting both the y- and z-axes (i.e. a direction perpendicularly intersecting the plane of FIG. 2).

A pair of deflectors 6A and 6B deflect the electron beam passing through the condenser lens 5 and lead it to a predetermined position on a dose control plate 50. An upper moving stage 7 causes the dose control plate 50 to move in the directions of the x- and y-axes. A pair of projection lenses 8 and 9 project an image of the dose control plate 50 irradiated with the electron beam onto a mask 60. A mask stage 10 causes the mask 60 to move in the directions of the x- and y-axes. The relationship between the dose control plate 50 and the mask 60 will be explained later. The lenses 2, 3, 5, 8 and 9 are electron lenses which generate an electric field or a magnetic field. Although the magnification ratio of the projection lenses 8 and 9 in this embodiment is set at 1:1 different ratios may be applicable. As the mask stage 10, it is possible to use various types of mask stage used in known electron beam transfer apparatuses. The upper moving stage 7 may have the same arrangement as that of the mask stage 10.

A pair of deflectors 11A and 11B deflect the electron beam passing through the mask 60. Projection lenses 12 and 13 project an image of the mask 60 irradiated by the electron beam onto a wafer 70 with an appropriate reduction ratio (e.g. 4:1). A second aperture 14 is provided near the cross-over image $CO_a$. A wafer stage 15 holds the wafer 70 and causes it to move in the directions of the x- and y-axes. An electron beam that scatters at an angle greater than a predetermined degree when passing through the mask 60 is blocked by the periphery of the second aperture 14 and hence not incident on the wafer 70.

A control power supply 20 outputs a predetermined exciting current to the deflecting coils of the deflectors 6A and 6B. A control power supply 21 outputs a pre-determined exciting current to the deflecting coils of the deflectors 11A and 11B. The output currents from the control power supplies 20 and 21 are set according to instructions from a controller 22. The controller 22 executes various arithmetic operations necessary for a transfer operation and also effects sequence control for various parts of the transfer apparatus. The controller 22 also controls the operations of the upper moving stage 7, the mask stage 10 and the wafer stage 15. Further, the controller 22 controls the condenser lenses 2, 3 and 5 and the projection lenses 8, 9, 12 and 13.

Figure 1A:
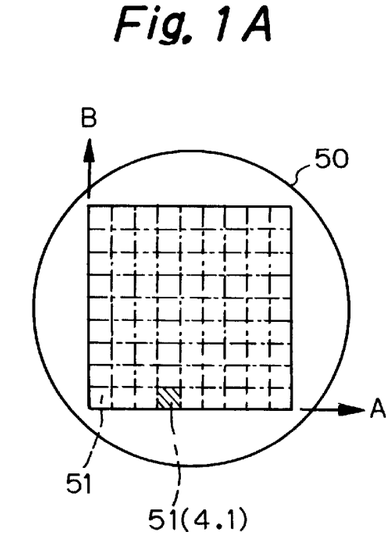
FIG. 1A is a plan view of a dose limiting member in a first embodiment of the present invention.
Figure 1B:
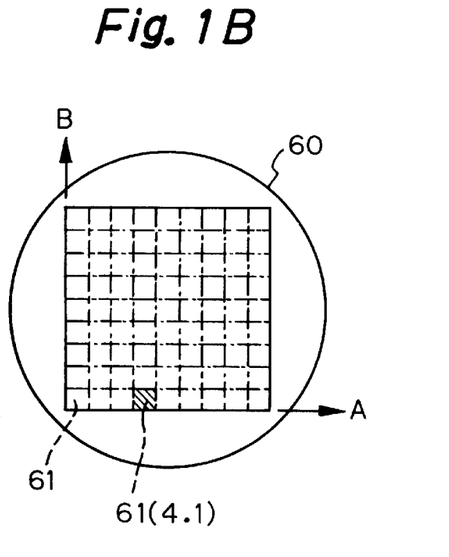
FIG. 1B is a plan view of a mask in the first embodiment of the present invention, which is used together with the dose limiting member shown in FIG. 1A.
Figure 2:
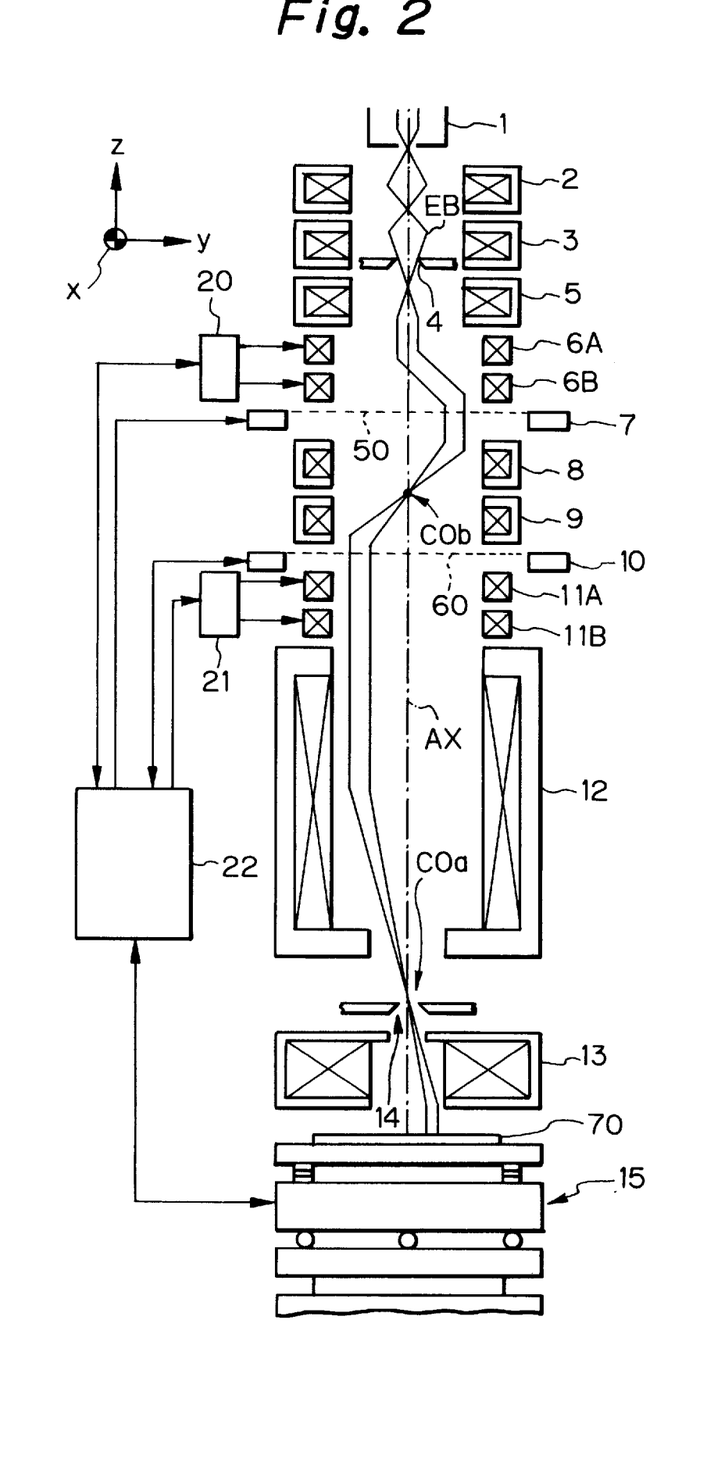
FIG. 2 schematically shows an electron beam reduction transfer apparatus used in the first embodiment.

FIGS. 1A and 1B show the respective planar configurations (as viewed in the direction of the optical axis AX) of the dose control plate 50 and the mask 60. As will be clear from these figures, the plate 50 is provided with a plurality of rectangular small areas 51 which are arrayed lengthwise and breadthwise, and the mask 60 is similarly provided with a plurality of rectangular small areas 61 arrayed lengthwise and breadthwise. The sizes of the small areas 51 and 61 are approximately equal to the cross-sectional size of the electron beam as led to the dose control plate 50 from the condenser lens 5. That is, the sizes of the small areas 51 and 61 are set such that each small area can be irradiated with the electron beam by one shot. The number and size of the small areas 51 are equal to those of the small areas 61. It should, however, be noted that the number of small areas 51 and 61 shown in the figures is merely an example.

Figure 1C:
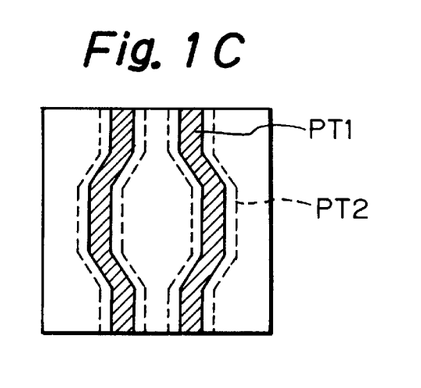
FIG. 1C shows patterns in one pattern area of the mask shown in FIG. 1B.
Figures 1D, 1E:
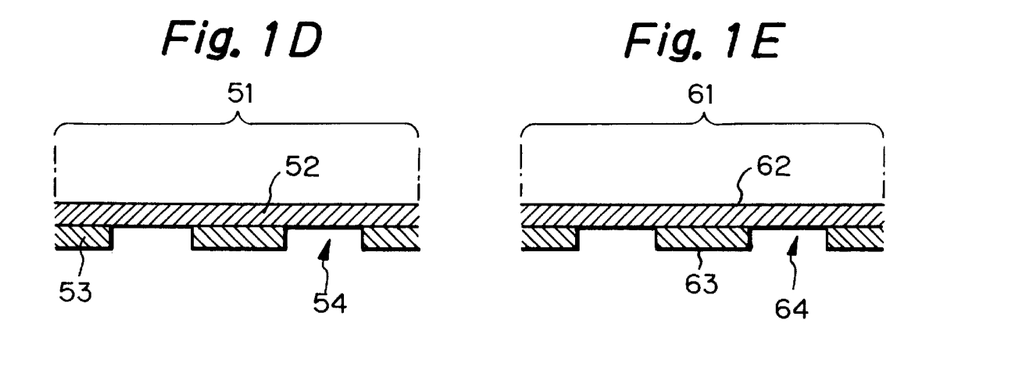
FIG. 1D is a sectional view of one small area on the dose limiting member shown in FIG. 1A.
FIG. 1E is a sectional view of one pattern area on the mask shown in FIG. 1B.

As shown in FIG. 1E, each small area 61 of the mask 60 is provided with a mask substrate 62 comprising such a thin film that the electron beam can pass through it, and a scattering member 63 which scatters the electron beam to a greater extent than the mask substrate 62. The mask substrate 62 and the scattering member 63 are disposed in each small area 61 according to a pattern to be provided in the area 61. The small area 61 is also referred to as "pattern area". At the mask 60, the electron beam incident on the scattering member 63 is scattered over a wide range, and the greater part of the incident electron beam is blocked by the second aperture 14. Accordingly, a pattern is transferred onto the wafer 70 according to the shape of a gap 64 between a pair of adjacent scattering member sections. The pattern (i.e. the shape of the gap 64) in the small area 61 is appropriately determined according to the wafer 70 to which transfer is to be effected. For example, as shown in part (b) of FIG. 3, an integrated circuit pattern which is to be transferred onto an area 71 defined for each individual die on the wafer 70 is divided into smaller patterns, and one of them is provided in a small area 61. As shown in FIG. 1D, each small area 51 of the dose control plate 50 is provided with a transmission substrate 52 comprising such a thin film that the electron beam can pass through it, and a scattering member 53 which scatters the electron beam to a greater extent than the transmission substrate 52. The layout of the transmission substrate 52 and the scattering member 53 is set for each individual small area 51 in association with the pattern provided in the corresponding small area 61 of the mask 60. This will be explained below.

Let us assume that the array directions of the small areas 51 and 61 of the dose control plate 50 and mask 60 are an A-axis direction and a B-axis direction, respectively, as shown in FIGS. 1A and 1B, and that small areas 51 and 61 which lie at the a-th position in the A-axis direction and at the b-th position in the B-axis direction from the respective small areas 51 and 61 which lie at the lower left ends in FIGS. 1A and 1B are expressed by "small area $51_{(a,b)}$" and "small area $61_{(a,b)}$", and further that, when the variables "a" and "b" of a small area $51_{(a,b)}$ and those of a small area $61_{(a,b)}$ agree with each other, these small areas are called "associated pair of small areas".

Assuming that an electron beam transmission pattern PT1 as shown by the hatching in FIG. 1C is to be provided in the small area $61_{(4,1)}$ in FIG. 1B, for example, a scattering member 63 is disposed in the small area $61_{(4,1)}$ so as to define a gap 64 following the transmission pattern PT1. Next, the small area $51_{(4,1)}$ of the dose control plate 50, which is associated with the small area $61_{(4,1)}$ of the mask 60, is provided with a scattering member 53 so as to define a gap 54 (see FIG. 1D) following an electron beam transmission pattern PT2 which is slightly wider than the transmission pattern PT1, as shown by the dashed line in FIG. 1C. Thus, when the small area $51_{(4,1)}$ is irradiated with the electron beam to project an image of the small area $51_{(4,1)}$ onto the small area $61_{(4,1)}$, a dark image of the scattering member 53 is projected onto the scattering member 63 in the small area $61_{(4,1)}$. In other words, the electron beam dose distribution in the small area $61_{(4,1)}$ is set so as to reduce the dose of electron radiation incident on the scattering member 63. Therefore, the electron radiation energy accumulated in the scattering member 63 considerably reduces in comparison to the conventional method in which the whole small area $61_{(4,1)}$ is irradiated with the electron beam at a uniform dose. Thus, the generation of heat from the mask 60 is effectively suppressed.

Associated pairs of small areas 51 and 61 other than the above are similarly arranged. That is, each small area 51 is provided with an electron beam transmission pattern which is slightly wider than an electron beam transmission pattern provided in a small area 61 associated with the small area 51. Accordingly, when an image of each small area 51 is projected onto the associated small area 61, the electron radiation dose in each small area 61 reduces at the scattering member 63 in the same way as in the associated pair of small areas $51_{(4,1)}$ and $61_{(4,1)}$. Thus, the generation of heat from the mask 60 is effectively suppressed. It should be noted that an aperture similar to the second aperture 14 may be provided near the crossover $CO_b$ where electron beams are caused to cross each other by the projection lenses 8 and 9, shown in FIG. 2, to prevent the electron beam scattered by the scattering member 53 of the small area 51 from being incident on the mask 60.

Figures 3A, 3B:
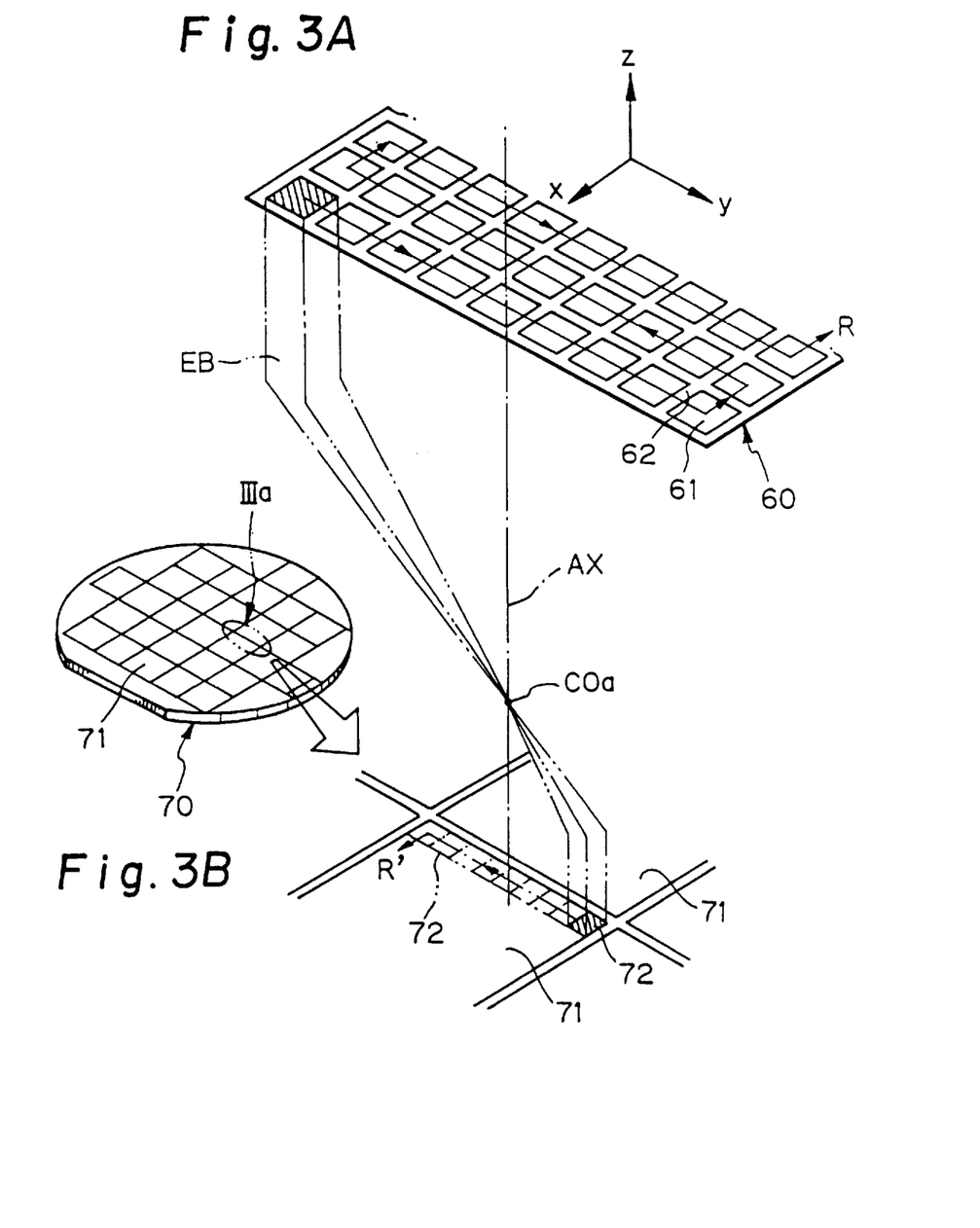
FIG. 3A shows the relationship between the mask and a radiation-sensitive substrate.
FIG. 3B shows the whole radiation-sensitive substrate.

Next, the procedure for effecting pattern transfer by associating the small areas 51 and 61 with each other, as described above, will be explained with reference to FIGS. 2 3A and 3B. It should be noted that x-, y- and z-axes in FIG. 3 are taken in respective directions in the same way as in FIG. 2. In FIGS. 3A and 3B, illustration of the dose control plate 50 is omitted. To effect pattern transfer, first, the mask 60 is mounted on the mask stage 10 with the array directions of the small areas 61 (i.e. the A- and B-axis directions in FIG. 1B) coincident with the x- and y-axis directions of the transfer apparatus. The dose control plate 50 is similarly mounted on the upper moving stage 7 with the array directions of the small areas 51 coincident with the x- and y-axis directions of the transfer apparatus. At this time, the dose control plate 50 is placed in reverse relation to the mask 60 in each of the x- and y-axis directions. In other words, the dose control plate 50 and the mask 60 are positioned such that the directions of the A- and B axes assumed in FIG. 1A are reverse to those of the mask 60 as mounted on the mask stage 10.

Upon completion of the mounting of the dose control plate 50 and the mask 60, the positions of the two stages 7 and 10 are adjusted such that the associated pair of small areas 51 and 61 of the dose control plate 50 and mask 60 are symmetric with respect to the crossover image $CO_b$. Thereafter, the stages 7 and 10 are continuously moved at the same speed in mutually opposite directions along the x-axis. The amount of deflection made by the deflectors 6A and 6B is sequentially controlled such that each small area 51 is successively irradiated with the electron beam for a predetermined period from one end of the dose control plate 50 in the y-axis direction toward the other end in synchronism with the continuous movement of the two stages 7 and 10. The electron beam sequentially applied to each small area 51 of the dose control plate 50 is sequentially led through the projection lenses 8 and 9 to a small area 61 associated with the small area 51.

In response to the irradiation of the mask 60 with the electron beam EB, an image of the electron beam transmission pattern provided in each small area 61 is projected as a reduced image onto the wafer 70 by the projection lenses 12 and 13. At this time, the positional relationship between the mask 60 and the wafer 70 is adjusted such that transfer areas 72 of the wafer 70 which correspond to the small areas 61 are contiguous with each other in an area 71 for one die. For this purpose, the wafer 70 is continuously moved in the opposite direction to the mask 60 along the y-axis by the wafer stage 15, and the incident position of the electron beam EB on the wafer 70 is adjusted by the deflectors 11A and 11B, shown in FIG. 2, such that the transfer areas 72 will not be separated from each other by an image of a boundary 62 that divides each pair of adjacent small areas 61 of the mask 60. By the above-described operation, a continuous pattern comprising a combination of the patterns provided in the small areas 61 is transferred onto the area 71 of the wafer 70. It should be noted that one example of the electron beam irradiation sequence for the small areas 61 of the mask 60 is shown by the arrow R in FIG. 3A, and the pattern transfer sequence for the wafer 70, which corresponds to the electron beam irradiation sequence, is shown by the arrow R'.

Control data for the operations of the upper moving stage 7, the mask stage 10 and the wafer stage 15 and the amounts of deflection made by the deflectors 6A, 6B, 11A and 11B, which are necessary for realizing the above-described transfer method, are previously obtained from design data concerning the mask 60 and the dose control plate 50. Therefore, the design data is previously stored in a storage unit (not shown) attached to the controller 22 and read into the controller 22 to control each operating part as the need arises.

Figure 4:
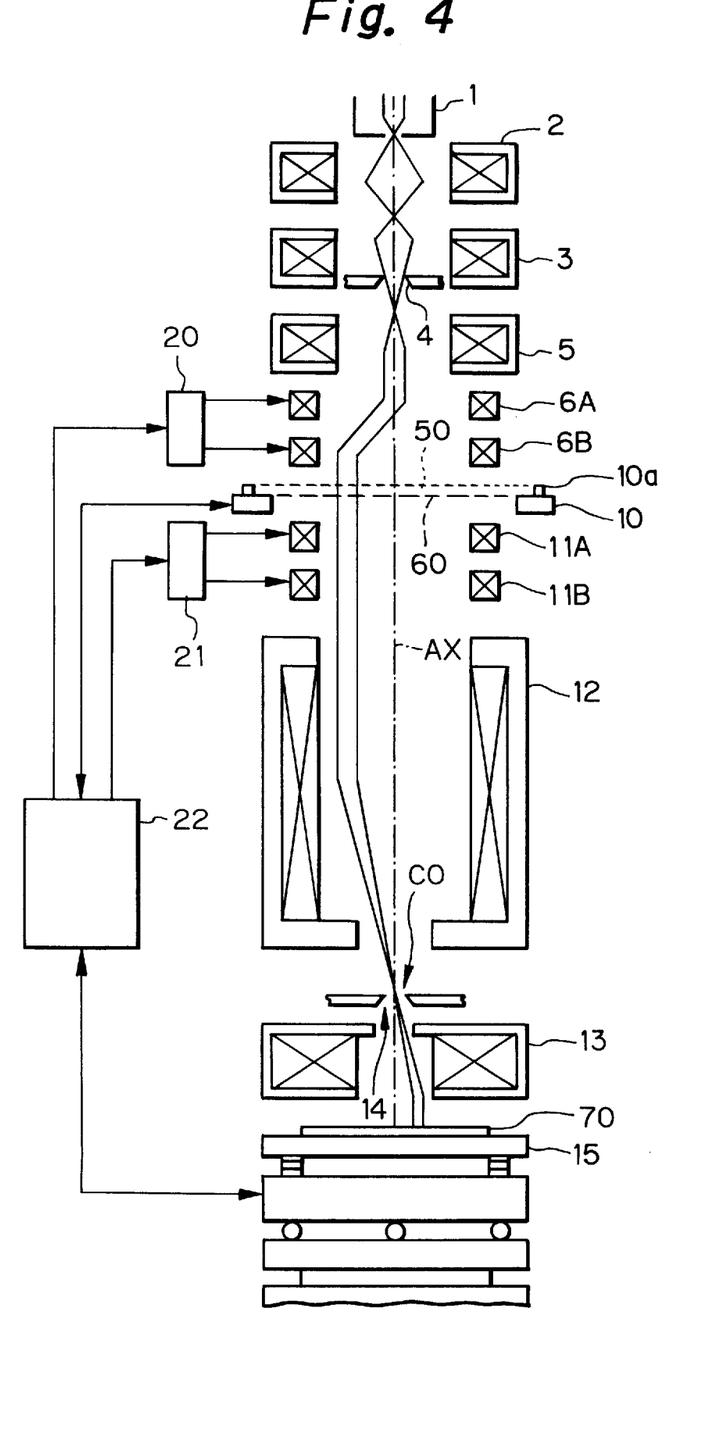
FIG. 4 schematically shows an electron beam reduction transfer apparatus used in a second embodiment of the present invention.

A second embodiment of the present invention will be described below with reference to FIG. 4. FIG. 4 schematically shows a transfer apparatus used in the second embodiment. It should be noted that members or portions which are common to the two transfer apparatuses shown in FIGS. 2 and 4 are denoted by the same reference characters, and repetitive description thereof is omitted. As will be clear from FIG. 4, in this embodiment, a holder 10a is provided on the mask stage 10, and the dose control plate 50 is supported by the holder 10a so as to lie over the mask 60. The holder 10a can adopt an arrangement similar to any of various arrangements used to hold the mask 60.

In this embodiment, the mask 60 and the dose control plate 50 are aligned such that each associated pair of small areas 51 and 61 are overlaid in the direction of the optical axis AX. Thereafter, the electron beam is sequentially led to each small area 51 of the dose control plate 50 by combinationally controlling the movement of the mask stage 10 and the deflection of the electron beam by the deflectors 6A and 6B. By doing so, the same action and effect as those in the first embodiment can be obtained. Because it is possible to omit the upper moving stage 7 and the projection lenses 8 and 9, shown in FIG. 2, the arrangement of the transfer apparatus can be simplified.

Figure 5:
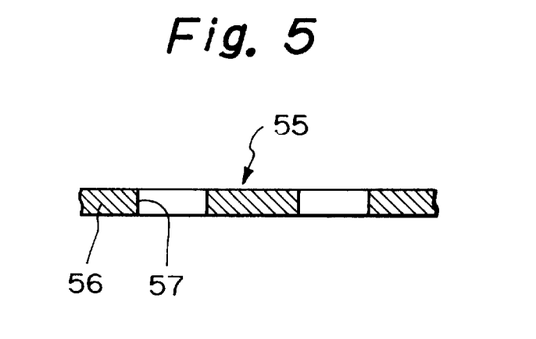
FIG. 5 shows a modification of the dose limiting member shown in FIG. 1D.
Figure 6:
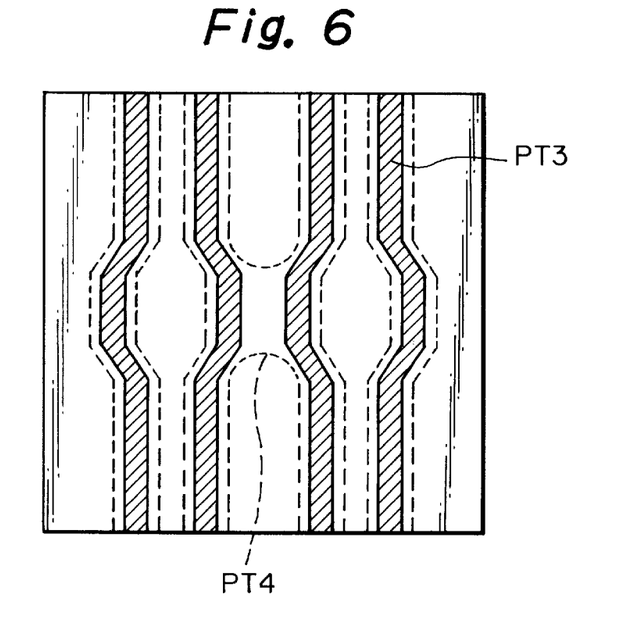
FIG. 6 shows a modification of a dose limiting member projected onto the mask as shown in FIG. 1C.

In the above-described embodiments, the dose control plate 50 can be produced in the same way as in the case of the mask 60. As the transmission substrate 52, for example, a thin film of single-crystal silicon may be used. As the scattering member 63, for example, polycrystalline silicon may be used. A metallic material may also be used to produce the dose control plate 50. The pattern of the dose control plate 50 is projected onto only the mask 60, but not onto the wafer 70. Therefore, the pattern accuracy of the dose control plate 50 may be much lower than that of the mask 60. Because thermal deformation of the dose control plate 50 has no effect on the transfer accuracy, the scattering member 53 may be formed with a sufficiently large thickness so as to function as an absorber that absorbs almost all electron radiation applied thereto. On the other hand, it is compulsory to minimize the energy absorption and the scattering of electron radiation when passing through a transmission pattern provided on the dose control plate 50 (i.e. a portion where no scattering member 53 is present). Accordingly, it is also possible to use a dose control plate 55 as shown in FIG. 5 in place of the dose control plate 50, shown in FIG. 1D. The dose control plate 55 comprises an absorbing substrate 56 which is sufficiently thick to absorb electron radiation satisfactorily, and which is provided with a through-hole (i.e. opening) 57 according to the desired transmission pattern. Meanwhile, patterns provided in the small areas 51 need not be as fine as those provided in the small areas 61; it is only necessary for a pattern provided in a small area 51 to reduce the electron radiation dose for at least a part of the corresponding scattering member 63 provided on the mask 60. In FIG. 6, for example, a transmission pattern PT4 of the dose control plate 50 is simplified, as shown by the dashed lines in the figure, relative to an electron beam irradiation pattern PT3 (hatched areas) provided on a specific small area 61 of the mask 60.

Figure 7:
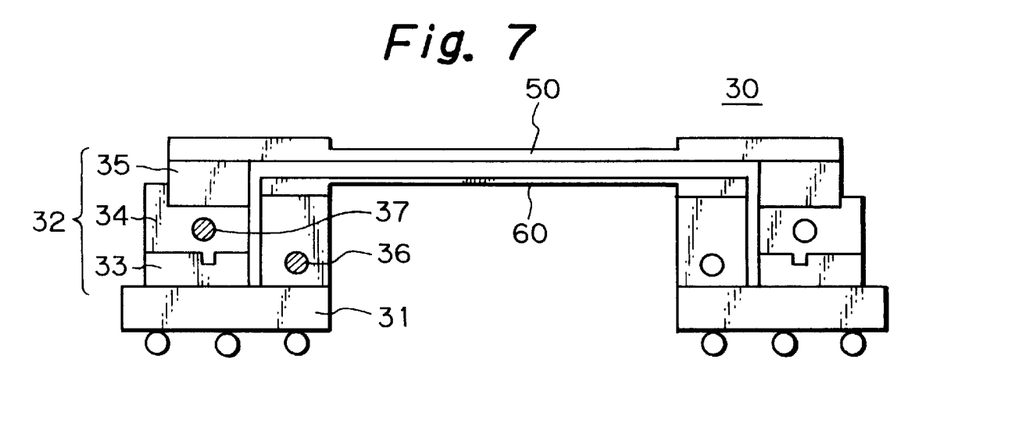
FIG. 7 shows one example of a device for holding and moving a dose control member and a mask.

To hold the dose control plate 50 and the mask 60, it is also possible to use a moving device 30 as shown in FIG. 7. The moving device 30 has a mask stage 31 for causing the mask 60 to move two-dimensionally in a plane perpendicularly intersecting the optical axis AX, and a plate support block 32 which is mounted on the top of the mask stage 31. The mask stage 31 has the same arrangement as that of the mask stage 10, shown in FIG. 2. The plate support block 32 has a y-axis fine-adjustment unit 33 which performs linear motion in the y-axis direction in FIG. 2 relative to the mask stage 31, an x-axis fine-adjustment unit 34 which is supported by the y-axis fine-adjustment unit 33 and performs linear motion in the x-axis direction in FIG. 2, and a rotation fine-adjustment unit 35 which is supported by the x-axis fine-adjustment unit 34 and performs rotational motion about an axis parallel to the z-axis in FIG. 2. The dose control plate 50 is supported by the rotation fine-adjustment unit 35 so as to lie over the mask 60. The position of the dose control plate 50 relative to the mask 60 is adjusted by the operations of the fine-adjustment units 33, 34 and 35. It should be noted that reference numerals 36 and 37 in FIG. 7 denote passages for circulating a constant-temperature fluid to prevent temperature change of the moving device 30.

The image of the dose control plate 50 may be projected as a reduced or enlarged image. The small areas 51 of the dose control plate 50 and the small areas 61 of the mask 60 need not have one-to-one correspondence to each other. The arrangement may be such that patterns which are provided in the small areas 61 of the mask 60 are classified in groups such that similar patterns belong to one group, and the dose control plate 50 is provided with common small areas 51 which are associated with the respective groups of small areas 61. If the electron beam incident on the dose control plate 50 is a parallel beam, the dose control plate 50 and the mask 60 need not be placed in close proximity to each other as in the second embodiment, and the projection lenses 8 and 9 in the first embodiment may be omitted.

Although in the foregoing embodiments a plurality of small areas 61 of the mask 60 are sequentially irradiated with the electron beam according to the order in which they are arranged, the electron beam irradiation sequence may be variously changed. One small area 61 may be irradiated with the electron beam two or more times. Alternatively, the electron beam may be applied to one or more small areas 61 selected from among a plurality of small areas 61. The present invention is also applicable in a case where the small areas 61 of the mask 60 are not divided by a boundary area 62, but contiguous with each other. Even in such a case, the same benefit can be attained when, in the range of a single electron beam irradiation, the dose of electron radiation applied per unit area of the beam limiting portion is reduced to a quantity smaller than the dose at the beam transmitting portion. The present invention is also applicable in a case where the upper moving stage 7 and the mask stage 10 are not present, i.e. a case where the dose control plate and the mask do not move.

What is claimed is:

1. A pattern transfer method, comprising:

directing a charged particle beam at a pattern area of a mask to transfer a pattern, defined by a beam transmitting portion and a beam limiting portion of the pattern area, onto a radiation-sensitive substrate; and varying a quantity of at least one portion of the charged particle beam reaching the pattern area, using a dose control member disposed between a radiation source of the charged particle beam and the mask, to lower the quantity of the charged particle beam per unit area of the beam limiting portion at the beam limiting portion with respect to the quantity of the charged particle beam per unit area of the beam transmitting portion at the beam transmitting portion.

2. A pattern transfer method, comprising:

directing a charged particle beam at a pattern area of a mask to transfer a pattern, defined by a beam transmitting portion and a beam limiting portion of the pattern area of the mask, onto a radiation-sensitive substrate;

transmitting a first portion of the charged particle beam through the beam transmitting portion;

reducing a quantity of a second portion of the charged particle beam, which reaches the beam limiting portion, per unit area of the beam limiting portion, to be lower than a quantity of the first portion of the charged particle beam per unit area of the beam transmitting portion, using a dose control member disposed between a radiation source of the charged particle beam and the mask; and limiting transmission of the second portion of the charged particle beam with the beam limiting portion.

3. A pattern transfer method according to claim 2, wherein said reducing includes at least one of scattering and absorbing the second portion of the charged particle beam with a dose limiting portion of the dose control member.

4. A pattern transfer method according to claim 3, further comprising transmitting the first portion of the charged particle beam through the dose control member at other than the dose limiting portion to irradiate the beam transmitting portion and an area extending along a periphery of the beam transmitting portion.

5. A pattern transfer method, comprising:

directing a charged particle beam at each of a plurality of pattern areas of a mask to transfer a corresponding plurality of patterns, each defined by a beam transmitting portion and a beam limiting portion of the respective pattern area, onto a radiation-sensitive substrate; and varying a quantity of at least one portion of the charged particle beam reaching each pattern area, using a dose control member disposed between a radiation source of the charged particle beam and the mask, to lower the quantity of the charged particle beam per unit area of the beam limiting portion at the beam limiting portion with respect to the quantity of the charged particle beam per unit area of the beam transmitting portion at the beam transmitting portion.

* * * * *